(12) United States Patent
Mangano et al.

(10) Patent No.: US 10,788,870 B2
(45) Date of Patent: Sep. 29, 2020

(54) RESET CIRCUIT, CORRESPONDING DEVICE AND METHOD

(71) Applicant: STMicroelectronics S.r.l., Agrate Brianza (MB) (IT)

(72) Inventors: Daniele Mangano, San Gregorio di Catania (IT); Gaetano Di Stefano, San Pietro Clarenza (IT); Mirko Dondini, Catania (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 16/405,086

(22) Filed: May 7, 2019

(65) Prior Publication Data

US 2019/0354152 A1    Nov. 21, 2019

(30) Foreign Application Priority Data

May 18, 2018   (IT) .......................... 102018000005511

(51) Int. Cl.
*G06F 1/24*     (2006.01)
*G06F 11/267*   (2006.01)
*H03K 3/037*    (2006.01)

(52) U.S. Cl.
CPC .............. *G06F 1/24* (2013.01); *G06F 11/267* (2013.01); *H03K 3/037* (2013.01)

(58) Field of Classification Search
None
See application file for complete search history.

(56) References Cited

U.S. PATENT DOCUMENTS

| | | | |
|---|---|---|---|
| 6,629,265 B1* | 9/2003 | Williams | G06F 1/24 713/323 |
| 2013/0176065 A1* | 7/2013 | Balmelli | H03K 17/223 327/198 |
| 2013/0293273 A1* | 11/2013 | Paul | H03K 17/223 327/143 |
| 2014/0089648 A1 | 3/2014 | Garnier et al. | |
| 2015/0026502 A1* | 1/2015 | Itou | G06F 1/24 713/340 |
| 2017/0160792 A1* | 6/2017 | Tokioka | H03K 17/223 |
| 2017/0168533 A1* | 6/2017 | Rhoads | G06F 1/24 |
| 2018/0081411 A1* | 3/2018 | Wan | G06F 1/3287 |

\* cited by examiner

*Primary Examiner* — Cassandra F Cox
(74) *Attorney, Agent, or Firm* — Slater Matsil, LLP (57) ABSTRACT

A circuit includes a first node configured to receive a reset signal. A reset drive stage drives a reset node. The reset drive stage is coupled to the first node via a reset signal path to propagate the reset signal to the reset drive stage. The reset drive stage is activated as a result of assertion of a reset actuation state of the reset signal. A sensing node is coupled to the reset node via a signal sensing path. The sensing node is sensitive to a signal level of the reset node reaching a reset threshold. A reset signal hold circuit block is coupled to the first node and is configured to receive a reset command signal and assert the reset actuation state of the reset signal at the first node as a result of the reset command signal received.

22 Claims, 5 Drawing Sheets

RESET CIRCUIT, CORRESPONDING DEVICE AND METHOD

CROSS-REFERENCE TO RELATED APPLICATIONS

This application claims priority to Italian Patent Application No. 102018000005511, filed on May 18, 2018, which application is hereby incorporated herein by reference.

TECHNICAL FIELD

The description relates to reset circuits.

BACKGROUND

A commonly recognized problem in devices such as microcontrollers may lie in making internal reset events (always) visible externally on a device reset pin, by also taking into account that the number of GPIO (General Purpose Input Output) pins can differentiate one device (for instance, a MicroController Unit or MCU) from another and that a reset functionality (dedicated pin) is a highly desirable feature.

A possible approach in addressing that problem may involve a temporization function implemented to allow reset propagation towards, for instance, a board onto which the device is mounted.

A drawback of that approach may be recognized in a maximum load capacitance admissible for the reset pin, which is specified in the device datasheet.

SUMMARY

One or more embodiments can contribute in providing improved solutions overcoming the drawbacks of such conventional solutions.

One or more embodiments may relate to a corresponding device (e.g., a MCU). One or more embodiments may relate to a corresponding method. One or more embodiments can be applied, for instance, to electronic controllers such as microcontrollers.

As an example, embodiments relate to a circuit comprising a first node configured to receive a reset signal. A reset drive stage drives a reset node. The reset drive stage is coupled to the first node via a reset signal path to propagate the reset signal to the reset drive stage. The reset drive stage is activated as a result of assertion of a reset actuation state of the reset signal. A sensing node is coupled to the reset node via a signal sensing path. The sensing node is sensitive to a signal level of the reset node reaching a reset threshold. A reset signal hold circuit block is coupled to the first node and is configured to receive a reset command signal and assert the reset actuation state of the reset signal at the first node as a result of the reset command signal received, wherein the reset signal hold circuit block is coupled to the sensing node and configured to de-assert the reset actuation state of the reset signal at the first node as a result of the signal level at the reset node reaching the reset threshold.

One or more embodiments may provide one or more of the following advantages: reset line driving capability rendered independent from external capacitive load, notionally no constraints placed on customer system in respect of reset line (maximum) capacitance value, and package pin count optimization.

One or more embodiments may involve a reset holder digital logic which facilitates a flexible configuration of pin functionalities and/or specific approaches to control pads depending on user options.

One or more embodiments may facilitate having reset acts (always) visible on an external reset line regardless of the capacitive load on the pin (as related, for instance, to board features).

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Throughout this description, reference will be made for ease of illustration to certain features which may be adopted in devices such as microcontrollers of the STM32 family of microcontrollers available with companies of the ST group as well as to designations currently adopted in documentation (for instance, data sheets) related to the STM32 family of microcontrollers.

This is a family of 32-bit Flash microcontrollers based on the Arm® Cortex®-M processor designed to offer new degrees of freedom to MCU users by offering products combining high performance, real-time capabilities, digital signal processing, and low-power and low-voltage operation, and connectivity, while maintaining full integration and ease of development.

It will be otherwise understood that referring to a microcontroller such as STM32 as exemplary of a device to which embodiments may apply has the sole purpose of facilitating a full, clear, concise and exact description of ways of carrying out the embodiments and is not to be construed, even indirectly, in a limiting sense of the embodiments.

The embodiments are not linked to specific features of controllers such as microcontrollers, for instance, of the STM32 family. More specifically, the embodiments may be applied to contexts where a reset signal is generated (internally) and propagated towards the exterior of a chip, e.g., on a system board, for instance, via pads. One or more embodiments are thus applicable to various contexts and are not limited to use in microcontrollers.

The embodiments thus apply to all arrangements encompassed by the claim language.

Figure 1:
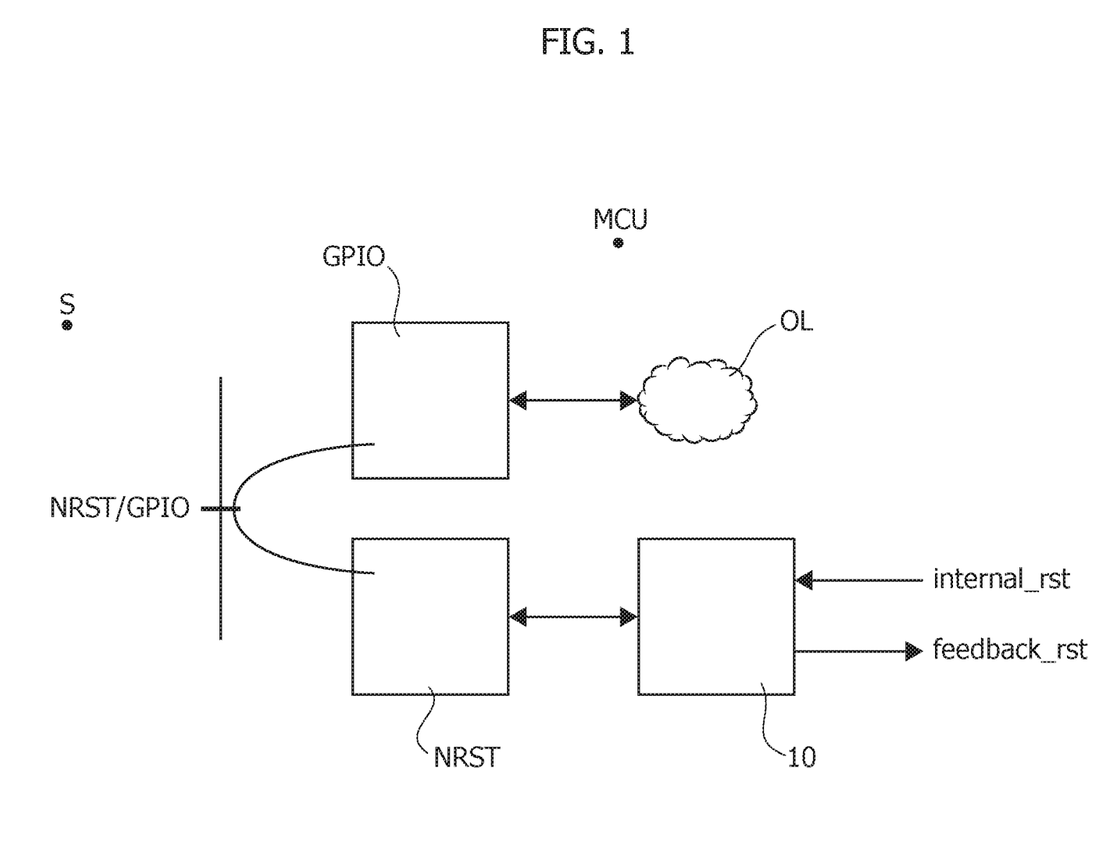
FIG. 1 is a block diagram exemplary of possible contexts of use of embodiments.

FIG. 1 is a block diagram exemplary of possible contexts of use of embodiments in an architecture used to share reset functionality between a device MCU (for instance, a microcontroller) and a system S (for instance, a board). In that respect it is once more stressed that a microcontroller is taken merely as a possible example of a device to which embodiments may apply, so that the embodiments are not to be construed, even indirectly, as limited to controllers such as microcontrollers.

In such a device (a microcontroller being taken as an example) a reset functionality should be desirably controllable both "externally" (that is, board S to microcontroller MCU) and "internally" (that is, microcontroller MCU to board S).

Various factors (cost reasons being exemplary of these) may suggest resorting to packages with reduced pin count so that a package pin NRST supporting a reset functionality can be shared with other functionalities.

As shown in FIG. 1, a GPIO (General Purpose Input Output) functionality may be exemplary of one such functionality shared with a reset functionality.

Such an arrangement can be managed within the device MCU by a device implementation where the same pin is bonded onto two pads: one dedicated to a reset functionality (NRST block in FIG. 1), and one dedicated to another functionality (see, for instance, the GPIO block in FIG. 1).

This facilitates coupling the same output pin (indicated NRST/GPIO on the left-hand side of FIG. 1) to other circuits such as another logic OL in addition to an NRST logic 10.

In an arrangement as exemplified in FIG. 1, reset input/output sharing can provide desirable features such as: a reset generated internally (internal_rst) can be propagated towards the NRST/GPIO pin and thus visible externally (for instance, on the board S); the device (for instance, the microcontroller MCU) can be reset both as a result of a reset request generated internally by the device and as a result of a reset request generated externally (that is, on the board) received at the NRST/GPIO pin; or reduced power consumption on the reset pad, due to pull-up driving being disabled as a result of reset forced by the device MCU, so that no useless DC current flow occurs through the pad.

Figure 2:
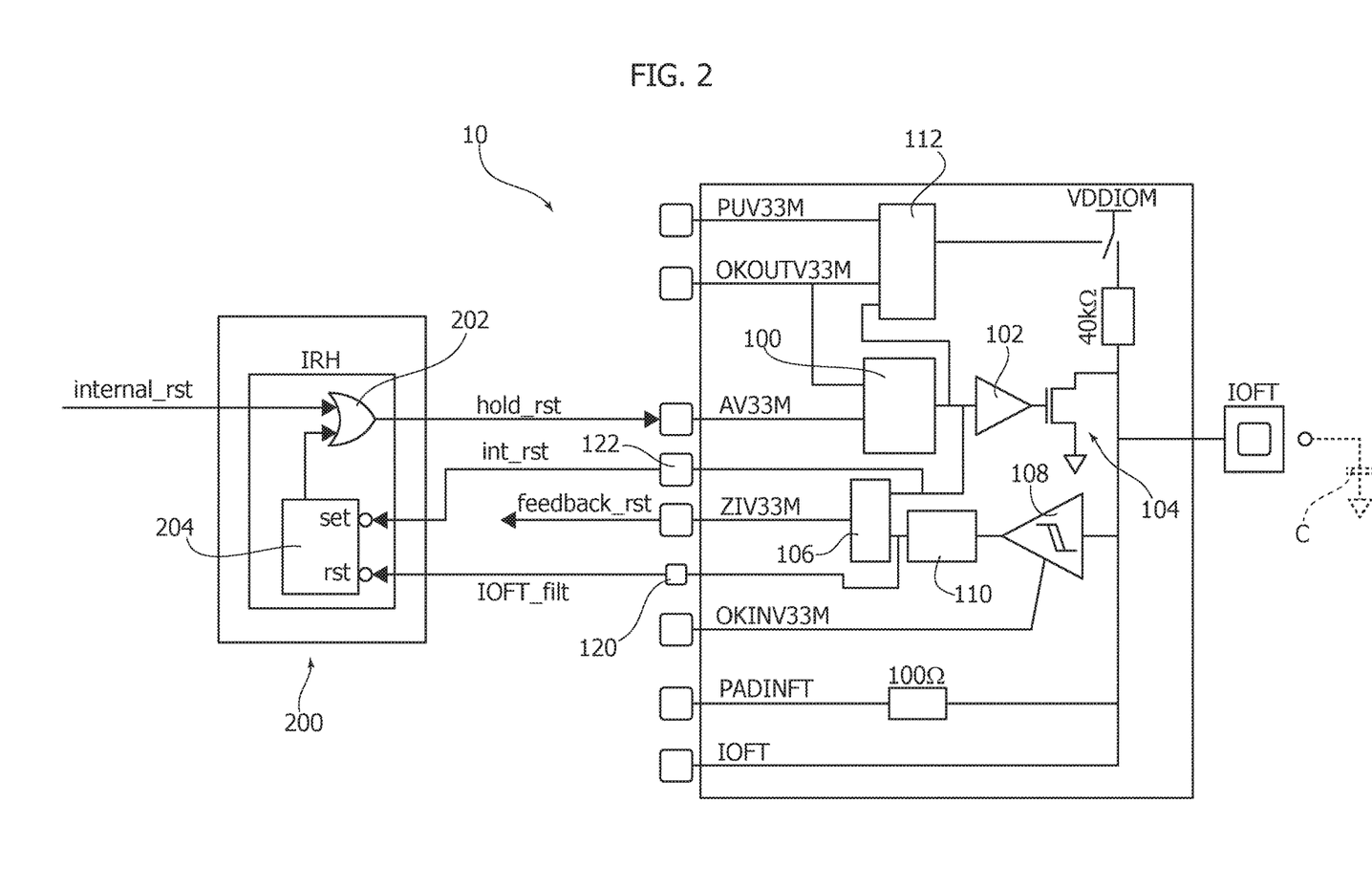
FIG. 2 is a functional circuit diagram exemplary of embodiments.

FIG. 2 provides a more detailed representation of a reset pad structure 10 which facilitates understanding both operation of conventional reset pad solutions and operation of embodiments. In that respect it is once more recalled that reference made herein for simplicity to certain features and designations adopted in microcontrollers such as microcontrollers of the STM32 family is not to be construed, even indirectly, in a limiting sense of the embodiments.

In an arrangement as exemplified in FIG. 2, an internal reset request internal_rst comprising a reset pulse (of variable width) as generated (in a manner known to those of skilled in the art) by a source within the device MCU can be forwarded towards a AV33M input pin of the reset pad 10.

The signal received at the AV33M input pin can be filtered (conditioned) by means of a logic 100 in order to remove potential signal glitches, critical for reset implementation, and "stretched" of a fixed amount of time at its second edge (rising or falling according to signal pulse polarity) by a temporization block.

The resulting stretched pulse can be used (possibly after inversion at 102) to drive an output stage 104 (for instance, an NMOS transistor) of the reset I/O pad 10. This may involve generating a pulse able to drive a pin IOFT of the pad 10.

As exemplified herein, the pin IOFT (in fact an input/output pin as discussed in the following) may have coupled therewith a capacitive load C as shown in dashed lines on the right-hand side of FIG. 2.

The elements in FIG. 2 discussed so far may be regarded as implementing an open-loop arrangement which does not provide any control of the effective driving of the reset line on the board (S in FIG. 1) in compliance with a reset pulse generated, for instance, internally of the device MCU.

To that effect, a reset signal received by the reset pad at the AV33M input pin, filtered and time-stretched at 100 can be sent back towards the device MCU by forwarding it (for instance, through an AND gate 106) towards an output pin ZIV33M of the reset pad 10 (feedback_rst).

Also, an external reset request can be received by the reset pad 10 at the (input/output) pin IOFT and fed to a Schmitt-trigger block 108 and a filter 110 for filtering and buffering to be sent back to the device MCU.

This may occur via the AND logic gate 106 (which may also sense the reset request on the internal path 100, 102, 104) and the output pin ZIV33M (again feedback_rst in FIG. 2) of the reset pad 10.

In an arrangement as exemplified in FIG. 2, as a result of the filtering and temporization logic 100 asserting the reset to drive the output stage 104 of the reset I/O pad 10, a corresponding signal can be sent to a Pull-Up logic control block (PUC) 112, that disables the connection (for instance, an electronic switch VDDIOM) to the power supply VDD and avoids useless power consumption.

It is observed that operation as discussed so far may suffer from an intrinsic limitation primarily related to propagating the reset generated internally (internal_rst) towards the NRST/GPIO pin to facilitate making it visible externally.

In fact, the reset pulse generated by the temporization logic 100 may not be long enough (in terms of time duration) to facilitate making the reset produced internally by the device MCU visible externally, for instance, on the board S.

Due to the fixed time used to stretch the reset pulse (this may be, for instance, 20 microseconds in a device as exemplified in FIG. 2), the reset line on the board side may not be actually brought to the desired reset value due to the presence of the capacitive load C seen at the IOFT pin of the reset I/O pad 10.

It is noted that, even if the temporization logic in the block 100 may keep the (e.g., NMOS) driving stage 104 still active for, e.g., 20 microseconds after the falling edge of internal_rst signal (as input downstream to the glitch filtering), this may not be enough for the signal at IOFT to reach a desired (e.g., low) value due to the (large) capacitance C to be discharged which is coupled to the pin IOFT.

As a result, at the application level, the system implemented on the board S and comprising the microcontroller MCU may not receive from the device MCU correct information about reset conditions generated in the device MCU.

This may lead, for instance, to certain expected system actions being missed and/or to wrong actions performed due to a value on the reset line which is unstable or wrong.

This risk can be attempted to be mitigated by indicating in the device datasheet a maximum load capacitance C admissible on the IOFT pin which facilitates proper propagation of internally-generated reset requests. This may result in a constraint/limitation imposed on on-board systems including the device.

One or more embodiments as exemplified in FIG. 2 (primarily the left-hand side thereof) aim at overcoming this limitation by implementing a closed-loop control on reset generation. This facilitates dispensing with dependency on load capacitance C and removing constraints (as reported on datasheets) impacting customer implementation.

One or more embodiments as exemplified in FIG. 2 contemplate the provision of dedicated digital control logic 200 (NRST logic) intended to act as a reset holder.

As exemplified in FIG. 2, the NRST logic 200 can be arranged "upfront" of the reset input/output pad 10 with the capability of holding the reset pulse internal_rst coming from internal reset sources for a time long enough to permit the reset line (e.g., IOFT) to reach a desired (e.g., lower) threshold value and to release the reset pulse (only) as a result of a notification that a reset has occurred as desired on the reset line.

This may occur, for instance, via a signal IOFT_filt provides over dedicated output 120 of the reset pad 10.

The left-hand side of FIG. 2 shows a (first) possible implementation example of the NRST logic 200.

In the example shown, the NRST logic 200 comprises an internal reset holder block IRH comprising an OR gate 202 having a first input configured to receive the internal reset signal (pulse) internal_rst and an output providing a reset pulse hold_rst to be applied to the AV33M pin.

Figure 3:
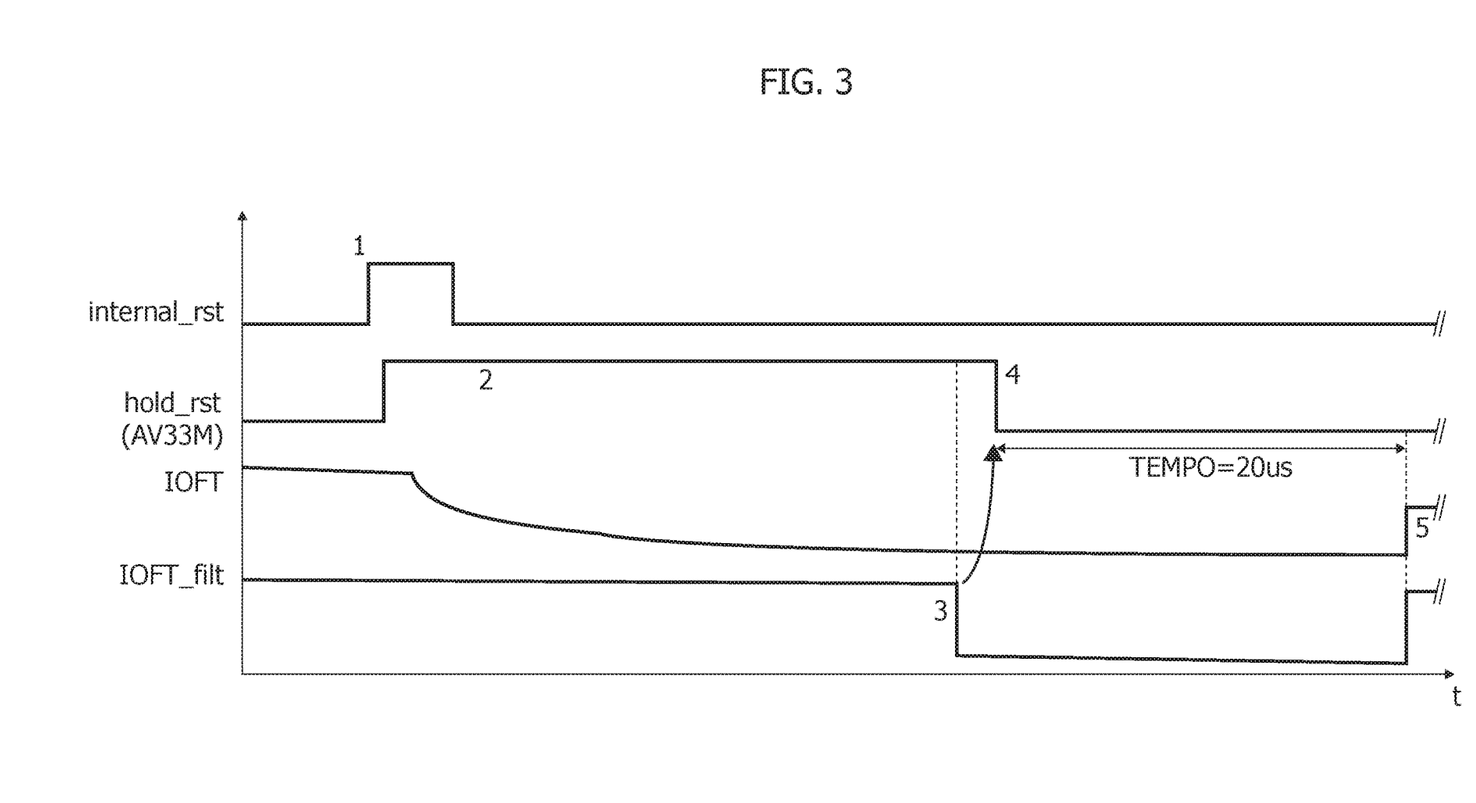
FIG. 3 comprises various diagrams exemplary of the time behavior of signals which may occur in embodiments.

Possible time behaviors of the signals internal_rst and hold_rst are exemplified by the two upper curves in the diagram of FIG. 3.

In the example of FIG. 2, the second input of the OR gate 202 is coupled to the output from a bi-stable element (e.g., a set-reset latch) 204 having a set input coupled to a pin 122 to receive therefrom a signal int_rst coming from the signal propagation path from the AV33M pin to the driving stage 104, e.g., from between the logic 100 and the inverter 102, this possibly being the same signal also applied to one of the inputs of the (AND) gate 106. A reset input is coupled to a pin 120 to receive therefrom a signal IOFT_filt originating from the Schmitt-trigger 108 coupled with the input/output pin IOFT and indicative of the fact that the signal at the pin IOFT has reached a desired (lower) threshold value.

Possible time behaviors of the signal at the input/output pin IOFT and the signal IOFT_filt are exemplified by the two lower curves in the diagram of FIG. 3.

In an arrangement as exemplified in FIGS. 2 and 3, an internal reset request internal_rst (which, as discussed previously, can be generated by different reset sources, possibly with different pulse widths) is manipulated by the logic 200 that combines it with the output of a storage element (the set-reset latch 204) through the OR logic gate 202.

In that way, the output signal from the OR gate 202, namely hold_rst, provides a "new" AV33M input to the reset input/output pad 10.

As shown in the diagram of FIG. 3, the rising edge of internal_rst (point 1 in the figure) is propagated as hold_rst to the pin AV33M of the pad 10 with the capability of reaching the logic 100, to be then propagated to the output stage 104, possibly after inversion at 102, in order to start driving the output reset line IOFT, and back to the device MCU through the output pin 122 (int_rst).

This latter signal is used in the logic 200 to drive the set input of the latch 204 and thus force hold_rst to stay asserted (point 2 in FIG. 3) even if the internal_rst pulse is no longer asserted, e.g., by being driven low by a reset source of the device.

In the meanwhile the output stage 104 of the pad has started to drive the output IOFT in order to force a desired (low) value, with the transient timing imposed by the load capacitance C coupled to IOFT.

The hold_rst signal is kept high and the NMOS output stage is driven until the reset line reaches the input buffer (lower) threshold as set in the Schmitt trigger buffer 108.

As a result of the reset line (IOFT signal) crossing the lower threshold (as indicated by point 3 in FIG. 3) the input buffer 108 switches its output from high to low.

This signal (possibly filtered to remove glitches on input) can be sent as IOFT_filt towards the device through the dedicated output pin 120 of the reset input/output pad 10.

The signal IOFT_filt can be used by the reset holder logic 200 as the notification of proper reset propagation to the IOFT pin, that is from the device MCU to the board S As exemplified herein, the signal IOFT_filt can be used to drive the reset input of the latch 204, causing hold_rst signal de-assertion (as indicated by point 4 in FIG. 3) on the falling edge of hold_rst.

As a result, the temporization logic 100 in the pad 10 may start computing a fixed time interval (see TEMPO in FIG. 3, e.g., 20 microseconds—this value is merely exemplary and not limiting of embodiments) after which the output stage 104 is switched off, so that additional time may be allowed to complete output reset driving (for instance, from the input buffer lower threshold voltage level towards ground).

From a notional viewpoint, one or more embodiments might thus facilitate dispensing with the temporization logic 100. Retaining such temporization may however be helpful insofar as this facilitates a minimum time duration of the reset line. For instance, in the presence of a small capacitance C and a fast reset activation at IOFT the temporization at 100 will facilitate avoiding the risk of having too short a reset pulse which may fail to reset the system adequately.

In one or more embodiments as exemplified herein, at the end of the fixed time applied (calculated) by the temporization block 100, the output stage 104 of the reset pad 10 will be switched off, thus removing driving (e.g., to "0") on the node IOFT.

Also, logic as 112 in the reset pad 10 may force a pull-up connection to drive (e.g., "1") on the node IOFT (point 5 in FIG. 3) to bring back the reset line to a non-active state (in embodiments as exemplified herein the reset line is "active-low").

Also, in one or more embodiments as exemplified herein, the rising edge on the IOFT node will propagate through the Schmitt trigger block 108 and cause the IOFT_filt signal to be disabled (back to, e.g., "1"), thus restoring the initial condition for reset holder 200 (latch 204), ready for another reset generation.

One or more embodiments as exemplified herein facilitate overcoming limitations on load capacitance (C in FIG. 2) while reducing—and notionally avoiding—the risk that a reset request may not be propagated towards the external board S.

In one or more embodiments as exemplified herein a closed-loop control arrangement facilitates "adapting" the duration of the pulse driving the NMOS stage 104 of the reset Input/Output pad according to the capacitive load C seen on pad output (node IOFT).

Figure 4:
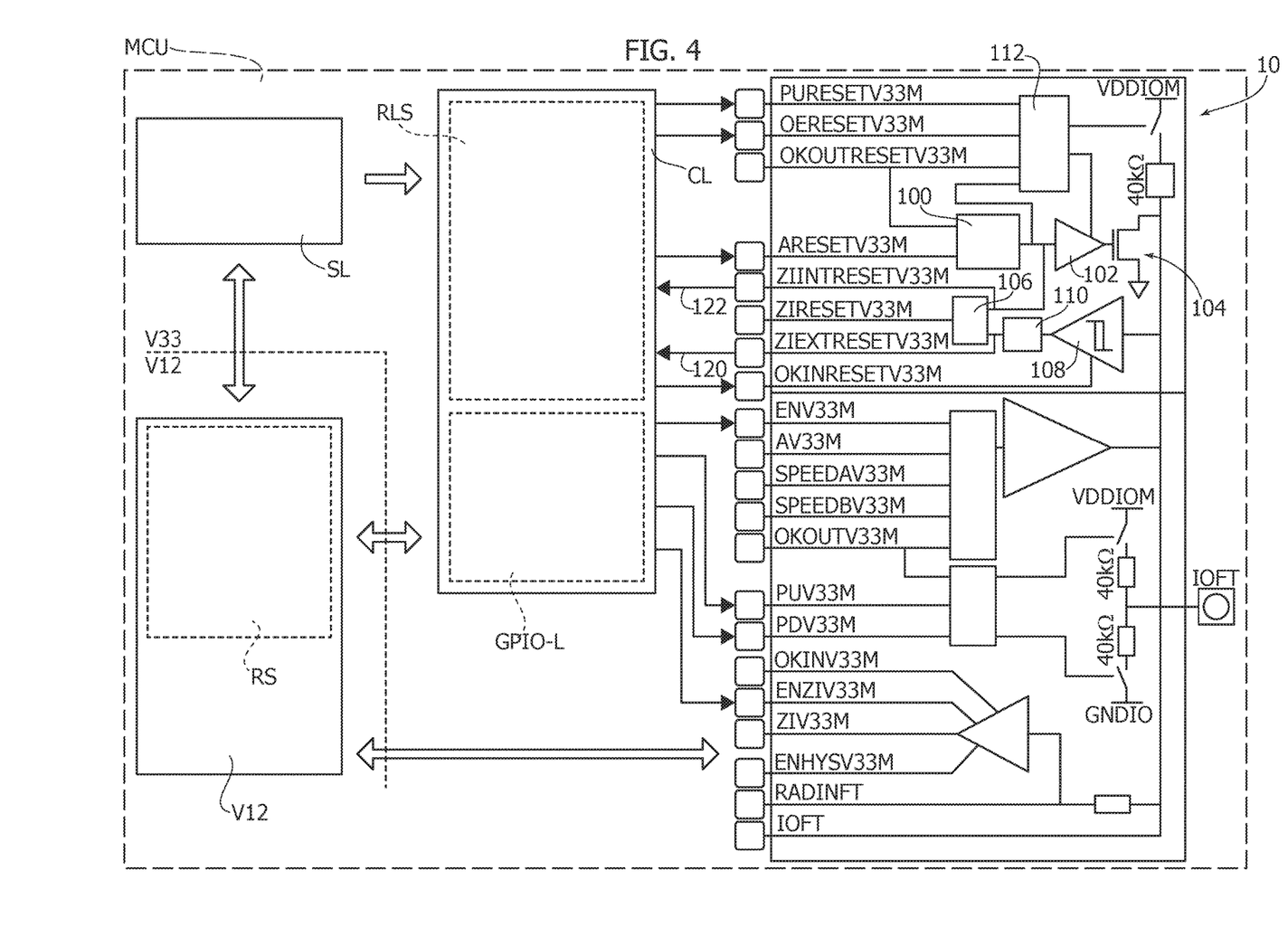
FIG. 4 is a more general representation exemplary of embodiments as applied to a (micro)controller unit.
Figure 5:
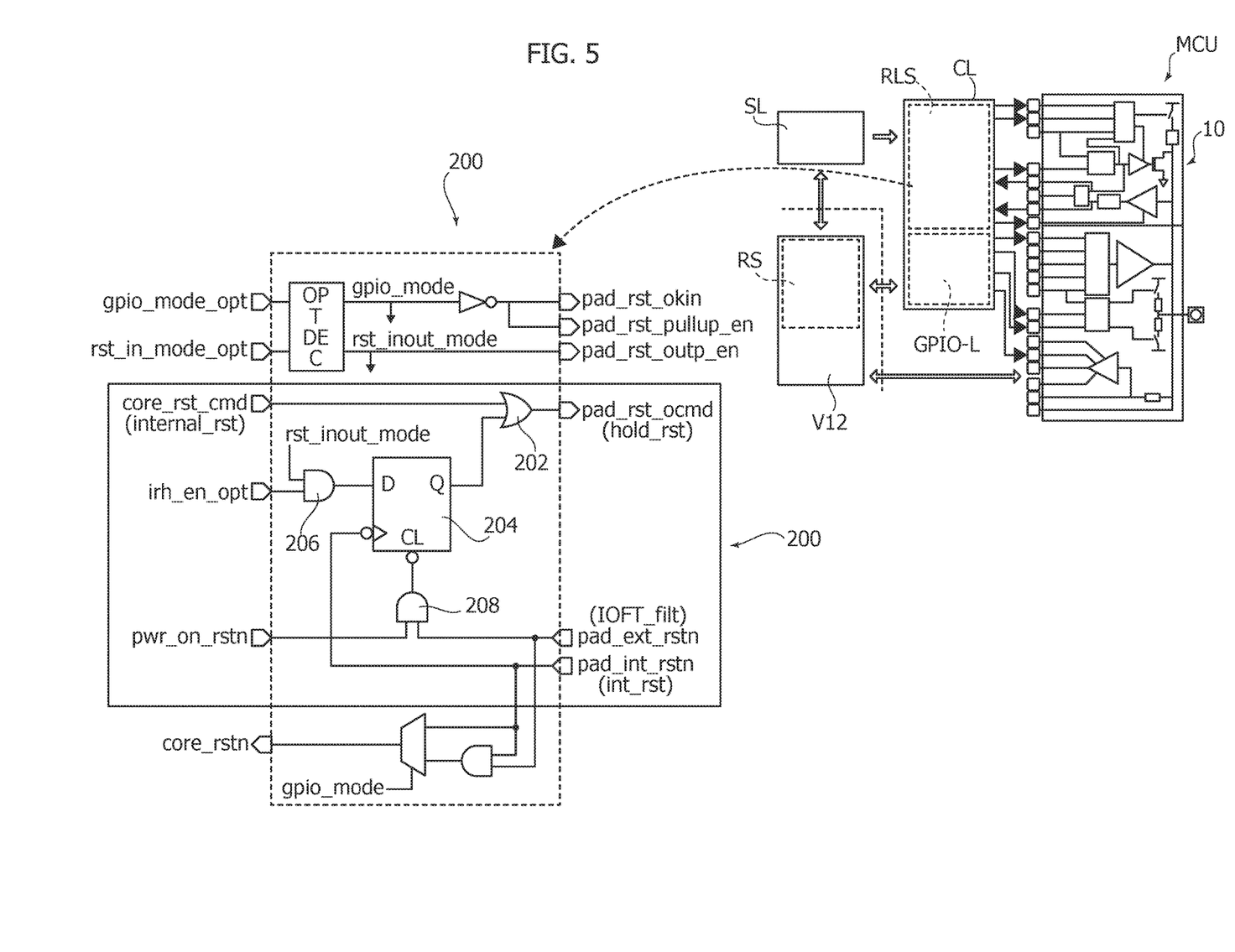
FIG. 5 is exemplary of a possible circuit implementation of embodiments.

FIGS. 4 and 5 are exemplary of possible implementations of microcontrollers wherein a "load independent" reset input/output pad 10 according to one or embodiments is shown combined with a General Purpose Input/Output, GPIO functionality, which per se is distinct from the embodiments, on the same pad within a MCU; this is only partly illustrated for simplicity.

In FIGS. 4 and 5 parts or elements like parts or element already discussed in connection with the previous figures are indicated with like reference signs, thus making it unnecessary to repeat a detailed description.

As noted, the General Purpose Input/Output, GPIO functionality is per se distinct from the embodiments. For that reason, while visible in the figure, those portions of the pad 10 dedicated to interfacing with the GPIO logic GPIO-L are not expressly referenced.

By adopting again—merely by way of example and with no limiting intent of embodiments—microcontroller (e.g., STM32) terminology, FIG. 4 refers to V12/V33 sections including V12 logic with a reset sampling block RS interfacing with V33 option bit sampling logic SL cooperating with a reset I/O control logic CL.

This in turn includes a reset logic circuit RLS (which may include the NRST logic 200 discussed previously) and GPIO logic circuit GPIO-L.

For immediate reference, the pins of the reset input/output pad 10 intended to cooperate with the reset logic circuit RLS are indicated in FIG. 4 with the same designations of FIG. 2 save for the possible insertion of the intermediate designation RESET for AV33M and ZIV33M, that is:

AV33M→ARESETV33M
ZIV33M→ZIRESETV33M and for the pins 120 and 122 being newly designated, that is:

pin 120→ZIEXTRESETV33M
pin 122→ZIINTRESETV33M.

From FIG. 4 it will be appreciated that one or more embodiments do not impose limitations on pad sharing features and can be managed by conventional device configuration options.

FIG. 5 is exemplary of another possible implementation of the reset holder logic circuit 200 in FIG. 2.

In FIG. 5, parts or elements like parts or elements already discussed in connection with the previous figures are indicated with like symbols in order to facilitate immediate reference thereto.

The implementation of FIG. 5 comprises a D flip-flop as the bi-stable component 204 having its Q node coupled to one input the OR gate 202 which receives on the other input (core_rst_cmd) the reset signal internal_rst.

In an implementation as exemplified in FIG. 5, the flip-flop 204 receives on its data pin D a combination (e.g., via an AND gate 206) of two configuration signals, which can identify possible operation modes of the reset logic 200.

For instance irh_en_opt may be a configuration signal to enable/disable, in a static or dynamic way, the reset holder logic 200. In addition, rst_inout_mode may be another configuration signal that indicates if the reset pad is configured to have both reset from MCU-to-System and System-to-MCU (as discussed previously), in order to selectively enable the reset holder logic 200.

These signals may be generated in manner known to those of skill in the art. Also, those of skill in the art will appreciate that a similar gating arrangement (e.g., an AND gate sensitive to signals such as irh_en_opt and rst_inout_mode) may be devised also for selectively enabling a latch-based arrangement as exemplified in FIG. 3.

The pin designated pad_int_rstn in FIG. 5 corresponds to the pin 122 in FIG. 2 (that is ZIINTRESETV33M in FIG. 4) and thus to the set input to 204 in the latch-based embodiment of FIG. 2 which receives the signal int_rst.

Its falling edge samples (as the clock input of the flip-flop 204) the value on the D input and allows to hold the reset command on pad_rst_cmd (hold_rst in FIG. 2), e.g., if both irh_en_opt and rst_inout_mode are "1": this is the start of hold reset phase as described in the time diagrams of FIG. 3.

In an implementation as exemplified in FIG. 5, pad_rst_cmd (hold_rst) will be removed as soon as the input pad_ext_rstn, which corresponds to the pin 120 in FIG. 2 (that is ZIEXTRESETV33M in FIG. 4) and thus to the reset input to 204 in the latch-based embodiment of FIG. 2, receives the signal IOFT_filt which has a falling edge, due to the reset propagated to the IOFT node.

This is made visible to the system (e.g., board S) and propagated back to the device through the Schmitt trigger buffer 108 because the flip-flop 204 is cleared asynchronously through its clear input CL: this corresponds to the end of the hold reset phase and the start of the temporization performed internally by reset pad as described in the time diagrams of FIG. 3.

In an implementation as exemplified in FIG. 5, the signal IOFT_filt on the input pad_ext_rstn is supplied to the clear input CL of the flip-flop 204 by applying it to an input of an AND gate 208 which receives on the other input a signal pwr_on_rstn used to provide a defined value to flip-flop D of reset holder at MCU start-up, when reset.

In comparison with FIG. 2, the implementation exemplified in FIG. 5 facilitates the use of available standard cell technologies and the provision of an enable/disable configuration via irh_en_opt (and rst_inout_mode). Also, an implementation as exemplified in FIG. 5, may give rise to a more robust solution, which may facilitate control also from the view point of testing.

The implementation of FIG. 5 is exemplary of configurability (enable/disable) and may be used in different contexts without introducing limitations, for instance, by acting via configuration options (static or dynamic), with a dedicated reset pad or a reset pad shared with GPIO features and/or with a reset pad that provides reset only in a MCU-to-System direction or in both directions.

In one or more embodiments, a circuit (e.g., 10), may comprise a first node (e.g., AV33M in FIG. 2 or ARESETV33M in FIG. 4) configured to receive a reset signal (e.g., hold_rst). A reset drive stage (e.g., 104) drives a reset node (e.g., IOFT). The reset drive stage is coupled to the first node via a reset signal path (e.g., 100, 102) to propagate the reset signal to the reset drive stage. The reset drive stage is activated (e.g., "active-low") as a result of assertion (e.g., to "1", see FIG. 3) of a reset actuation state of the reset signal. A sensing node (e.g., 120 in FIGS. 2 and 4; ZIEXTRESETV33M in FIG. 4; pad_ext_rstn in FIG. 5) is coupled to the reset node via a signal sensing path (e.g., 108, 110). The sensing node is sensitive to a signal level (e.g., IOFT_filt) of the reset node reaching a reset threshold (e.g., as set in 108). A reset signal hold circuit block (e.g., 200) is coupled to the first node and is configured to receive (e.g., at 202) a reset command signal (e.g., internal_rst) and assert the reset actuation state of the reset signal at the first node as a result of the reset command signal received. The reset signal hold circuit block (200) is coupled to the sensing node and configured to de-assert (e.g., to "0": see FIG. 3) the reset actuation state of the reset signal at the first node as a result of the signal level at the reset node reaching the reset threshold.

One or more embodiments may comprise a temporization circuit block (e.g., 100) in the first signal path, the temporization circuit block configured to maintain activation of the reset drive stage for a time interval (see TEMPO in FIG. 3) following de-assertion of the reset actuation state of the reset signal at the first node.

One or more embodiments may comprise a pull-up circuit block (e.g., 112) coupled to the temporization circuit block and the reset node, the pull-up circuit block configured to force the reset node to a non-active state (e.g., VDDIOM) as a result of expiration of the time interval.

One or more embodiments may comprise threshold circuitry (e.g., the Schmitt trigger 108) in the signal sensing path providing the reset threshold (108), wherein the sensing node coupled to the reset node via the signal sensing path is at a first resp. a second signal level (e.g., IOFT_filt, "1" and "0") as a result of the signal level at the reset node of the reset drive stage having not reached, resp. having reached the reset threshold.

One or more embodiments may comprise OR-type logic circuitry (e.g., 202) having an output coupled to the first node to provide the reset signal to the first node, a first input configured to receive the reset command signal, and a second input coupled to the sensing node. With the sensing node at the first level, the output of the OR-type logic circuitry holds the reset signal provided to the first node in the asserted state (e.g., "1") irrespective of the value of the reset command signal.

One or more embodiments may comprise a further sensing node (e.g., 122 in FIGS. 2 and 4; ZIINTRESTV33M in FIG. 4; pad_int_rstn in FIG. 5) coupled to the first signal path and wherein the reset signal hold circuit block comprises a bi-stable circuit block (e.g., 204, a latch as shown in FIG. 2 or a flip-flop as shown in FIG. 5) with an output coupled to the second input of the OR-type logic circuitry as well as state switching inputs (e.g., the set/reset inputs of the latch in FIG. 2 or the clock and clear CL inputs of the flip-flop in FIG. 5) coupled to the sensing node (e.g., 120/ZIEXTRESETV33M coupled to rst in FIG. 2 or pad_ext_rstn coupled to CL in FIG. 5) and the further sensing node (e.g., 122/ZIINTRESETV33M coupled to set in FIG. 2 or pad_int_rstn coupled to the clock of the flip-flop in FIG. 5).

In one or more embodiments the bi-stable circuit block may comprise an enable/disable input (e.g., 206; irh_en_opt; rst_inout_mode) to selectively enable/disable the reset signal hold circuit block.

In one or more embodiments, the bi-stable circuit block may comprise a latch circuit block with an output coupled to the second input of the OR-type logic circuitry as well as set/reset inputs coupled to the further sensing node (e.g., 122 coupled to the set input) and the sensing node (e.g., 120 coupled to the reset input).

In one or more embodiments, the bi-stable circuit block may comprise a flip-flop with an output (e.g., Q) coupled to the second input of the OR-type logic circuitry as well as clock and clear inputs coupled to the further sensing node (e.g., pad_int_rstn coupled to the clock input) and to the sensing node (e.g., pad_ext_rstn coupled to CL).

In one or more embodiments, a device (such as, e.g., a microcontroller, MCU) may comprise a reset circuit according to one or more embodiments.

In one or more embodiments, the device may be configured to generate internal reset command signals (e.g., internal_rst) generated internally of the device, the internal reset command signals applied to the reset signal hold circuit block in the reset circuit to assert the reset actuation state of the reset signal at the first node as a result of the internal reset command signal received.

One or more embodiments may comprise a reset pin (e.g., NRST/GPIO in FIG. 1) coupled to the reset node in the reset circuit, wherein the reset pin of the device is sensitive to internal reset command signals generated internally of the device.

One or more embodiments may comprise a reset pin (NRST/GPIO) coupled to the reset node in the reset circuit, wherein the reset pin may be configured to receive external reset command signals generated externally of the device, wherein the reset circuit comprises logical combination circuitry (e.g., 106) coupled to the first signal path (e.g., 100, 102) and to the signal sensing path (e.g., 108, 110) and configured (see e.g., ZIV33M in FIG. 2) to propagate signals (e.g., feedback_rst in FIGS. 1 and 2) indicative of internal reset command signals generated internally of the device as well as of external reset command signals generated externally of the device.

A method of operating a circuit according to one or more embodiments may comprise applying a reset command signal (e.g., internal_rst) to the reset signal hold circuit block (e.g., 200), and sensing the signal level (e.g., IOFT_filt) at the reset node reaching the reset threshold. The signal level at the reset node reaching the reset threshold is indicative of the reset command signal applied to the reset signal hold circuit block having been actuated at the reset node of the reset drive stage (104).

Without prejudice to the underlying principles, the details and embodiments may vary, even significantly, with respect to what has been described by way of example only, without departing from the extent of protection.

The extent of protection is determined by the annexed claims.

What is claimed is:

1. A circuit, comprising:
   a first node configured to receive a reset signal;
   a reset drive stage configured to drive a reset node, the reset drive stage coupled to the first node via a reset signal path to propagate the reset signal to the reset drive stage, wherein the reset drive stage is activated as a result of assertion of a reset actuation state of the reset signal;
   a sensing node coupled to the reset node via a signal sensing path, the sensing node sensitive to a signal level of the reset node reaching a reset threshold; and
   a reset signal hold circuit block coupled to the first node and configured to receive a reset command signal and assert the reset actuation state of the reset signal at the first node as a result of the reset command signal being received, wherein the reset signal hold circuit block is coupled to the sensing node and configured to de-assert the reset actuation state of the reset signal at the first node as a result of the signal level at the reset node reaching the reset threshold.

2. The circuit of claim 1, comprising a temporization circuit block in the reset signal path, the temporization circuit block configured to maintain activation of the reset drive stage for a time interval following de-assertion of the reset actuation state of the reset signal at the first node.

3. The circuit of claim 2, further comprising a pull-up circuit block coupled to the temporization circuit block and the reset node, the pull-up circuit block configured to force the reset node to a non-active state as a result of expiration of the time interval.

4. The circuit of claim 1, comprising threshold circuitry in the signal sensing path, the threshold circuit configured to provide the reset threshold, wherein the sensing node coupled to the reset node via the signal sensing path is at a first signal level as a result of the signal level at the reset node of the reset drive stage having not reached the reset threshold or at a second signal level as a result of the signal level at the reset node of the reset drive stage having reached the reset threshold.

5. The circuit of claim 4, further comprising OR-type logic circuitry having:
an output coupled to the first node to provide the reset signal to the first node;
a first input configured to receive the reset command signal; and
a second input coupled to the sensing node.

6. The circuit of claim 5, wherein the output of the OR-type logic circuitry is configured to hold the reset signal provided to the first node in the asserted reset actuation state irrespective of the value of the reset command signal when the sensing node is at the first signal level.

7. The circuit of claim 5, further comprising a further sensing node coupled to the reset signal path and wherein the reset signal hold circuit block comprises a bi-stable circuit block with an output coupled to the second input of the OR-type logic circuitry as well as state switching inputs coupled to the sensing node and the further sensing node.

8. The circuit of claim 7, wherein the bi-stable circuit block comprises an enable/disable input to selectively enable/disable the reset signal hold circuit block.

9. The circuit of claim 7, wherein the bi-stable circuit block comprises a latch circuit block with an output coupled to the second input of the OR-type logic circuitry as well as set/reset inputs coupled to the further sensing node and the sensing node.

10. The circuit of claim 7, wherein the bi-stable circuit block comprises a flip-flop with an output coupled to the second input of the OR-type logic circuitry as well as clock and clear inputs coupled to the further sensing node and the sensing node.

11. The circuit of claim 1,
wherein the reset command signal is applied to the reset signal hold circuit block; and
wherein the signal level is sensed at the reset node reaching the reset threshold, wherein the signal level at the reset node reaching the reset threshold is indicative of the reset command signal applied to the reset signal hold circuit block having been actuated at the reset node of the reset drive stage.

12. A microcontroller unit formed in an integrated circuit chip, the microcontroller unit comprising:
a common input/output pin couplable to a node outside of the integrated circuit chip;
a first internal pad coupled to the common input/output pin, the first internal pad being coupled to circuits within the integrated circuit chip;
a second internal pad coupled to the common input/output pin, the second internal pad being coupled to a first node that is configured to receive a reset signal;
a reset drive stage configured to drive a reset node, the reset drive stage coupled to the first node via a reset signal path to propagate the reset signal to the reset drive stage, wherein the reset drive stage is activated as a result of assertion of a reset actuation state of the reset signal;
a sensing node coupled to the reset node via a signal sensing path, the sensing node sensitive to a signal level of the reset node reaching a reset threshold; and
a reset signal hold circuit block coupled to the first node and configured to receive a reset command signal and assert the reset actuation state of the reset signal at the first node as a result of the reset command signal being received, wherein the reset signal hold circuit block is coupled to the sensing node and configured to de-assert the reset actuation state of the reset signal at the first node as a result of the signal level at the reset node reaching the reset threshold.

13. The microcontroller unit of claim 12, wherein the microcontroller unit is configured to generate an internal reset command signal that is generated internally of the microcontroller unit, the internal reset command signal to be applied to the reset signal hold circuit block to assert the reset actuation state of the reset signal at the first node as a result of the internal reset command signal being received.

14. The microcontroller unit of claim 12, wherein the common input/output pin is sensitive to an internal reset command signal generated internally of the microcontroller unit.

15. The microcontroller unit of claim 14, wherein the common input/output pin is configured to receive an external reset command signal that is generated externally of the microcontroller unit, wherein the microcontroller unit comprises logical combination circuitry coupled to the reset signal path and to the signal sensing path and configured to propagate signals indicative of the internal reset command signal as well as of the external reset command signal.

16. The microcontroller unit of claim 12, comprising threshold circuitry in the signal sensing path, the threshold circuit configured to provide the reset threshold, wherein the sensing node coupled to the reset node via the signal sensing path is at a first signal level as a result of the signal level at the reset node of the reset drive stage having not reached the reset threshold or at a second signal level as a result of the signal level at the reset node of the reset drive stage having reached the reset threshold.

17. The microcontroller unit of claim 16, further comprising OR-type logic circuitry having:
an output coupled to the first node to provide the reset signal to the first node;
a first input configured to receive the reset command signal; and
a second input coupled to the sensing node;
wherein the output of the OR-type logic circuitry is configured to hold the reset signal provided to the first node in the asserted reset actuation state irrespective of the value of the reset command signal when the sensing node is at the first signal level.

18. The microcontroller unit of claim 17, further comprising a further sensing node coupled to the reset signal path and wherein the reset signal hold circuit block comprises a bi-stable circuit block with an output coupled to the second input of the OR-type logic circuitry as well as state switching inputs coupled to the sensing node and the further sensing node.

19. A method of operating an integrated circuit chip, the method comprising:
receiving an internal reset signal from circuitry within the integrated circuit chip;

asserting a reset actuation state of a reset signal at an internal reset node of the integrated circuit chip as a result of the internal reset signal being received;

sensing a signal level at an external reset node of the integrated circuit chip, the external reset node configured to receive an external reset signal from outside the integrated circuit chip; and de-asserting the reset actuation state of the reset signal at the internal reset node as a result of the signal level at the external reset node reaching a reset threshold.

20. The method of claim 19, wherein the de-asserting is performed upon lapse of a time interval following the signal level at the external reset node reaching the reset threshold.

21. The method of claim 19, wherein sensing the signal level comprises sensing a first signal level when the signal level at the external reset node has not reached a reset threshold and sensing a second signal level when the signal level at the external reset node has reached the reset threshold.

22. The method of claim 21, comprising remaining in the reset actuation state irrespective of the value of the internal reset signal when the external reset node is at the first signal level.

\* \* \* \* \*